United States Patent
Potter et al.

(10) Patent No.: US 12,133,353 B2
(45) Date of Patent: Oct. 29, 2024

(54) REMOVABLE AIR DAMS FOR AIR COOLING IN COMPUTER SYSTEMS

(71) Applicant: Hewlett Packard Enterprise Development LP, Houston, TX (US)

(72) Inventors: Andrew Benjamin Potter, Houston, TX (US); John R. Grady, Cypress, TX (US); Arthur G. Volkmann, Spring, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 205 days.

(21) Appl. No.: 17/848,016

(22) Filed: Jun. 23, 2022

(65) Prior Publication Data
US 2023/0422427 A1    Dec. 28, 2023

(51) Int. Cl.
*H05K 7/20* (2006.01)
*G06F 1/20* (2006.01)

(52) U.S. Cl.
CPC .......... *H05K 7/20145* (2013.01); *G06F 1/20* (2013.01)

(58) Field of Classification Search
CPC .......... H05K 7/20145; H05K 7/20727; H05K 7/20563; H05K 7/20163; G06F 1/20; G06F 1/181; H01L 23/3675; H01L 23/467
See application file for complete search history.

(56) References Cited

U.S. PATENT DOCUMENTS

| | | | |
|---|---|---|---|
| 7,817,417 B2 | 10/2010 | Franz et al. | |
| 8,622,790 B2 * | 1/2014 | Chou | F24F 13/00 454/184 |
| 11,102,910 B2 | 8/2021 | Donachy et al. | |
| 2009/0034190 A1 * | 2/2009 | Tsai | H05K 7/20145 361/695 |
| 2011/0317359 A1 * | 12/2011 | Wei | F15D 1/0005 361/690 |
| 2012/0020013 A1 * | 1/2012 | Li | G06F 1/20 138/46 |

(Continued)

FOREIGN PATENT DOCUMENTS

CN     107463234 A  * 12/2017  .............. G06F 1/20

OTHER PUBLICATIONS

Chi; 'General wind guide cover', Dec. 12, 2017, Zhengzhou Yunhai Information Tech Co Ltd, Description (Espacenet Machine Translation of CN 107463234 A) (Year: 2017).*

(Continued)

*Primary Examiner* — Stephen S Sul
*Assistant Examiner* — Jeffrey Francis Stoll
(74) *Attorney, Agent, or Firm* — Yao Legal Services, Inc.

(57) ABSTRACT

An air baffle assembly for air cooling in computer systems is described. The air baffle assembly can include a baffle body removably installed on a printed circuit assembly deployed on a chassis. The baffle body can cover memory components. The air baffle assembly can also include an air dam removably installed on the baffle body. The baffle body has a slot positioned on a side of the baffle body, which can be substantially parallel to a wall of the chassis. The baffle body can further include alignment rails positioned in the slot to guide installation of the air dam into the slot. The installed air dam can reduce a bypass region, thereby reducing airflow through the bypass region and increasing airflow through the memory components.

20 Claims, 7 Drawing Sheets

(56) References Cited

U.S. PATENT DOCUMENTS

| | | | |
|---|---|---|---|
| 2012/0026680 A1* | 2/2012 | Ke | G06F 1/20 |
| | | | 361/695 |
| 2013/0052934 A1* | 2/2013 | Tang | G06F 1/20 |
| | | | 454/284 |
| 2013/0155625 A1* | 6/2013 | Yin | G06F 1/20 |
| | | | 361/720 |
| 2014/0334093 A1* | 11/2014 | Wei | H05K 7/20727 |
| | | | 138/46 |
| 2014/0376174 A1* | 12/2014 | Dean | H05K 1/14 |
| | | | 361/679.46 |
| 2015/0060015 A1* | 3/2015 | Zhang | G06F 1/20 |
| | | | 165/96 |
| 2016/0224079 A1* | 8/2016 | Chinnakkonda Vidyapoornachary | H05K 7/20145 |
| 2017/0202112 A1* | 7/2017 | Mühsam | G06F 1/206 |
| 2017/0212570 A1* | 7/2017 | Norton | G06F 1/3212 |
| 2019/0098795 A1* | 3/2019 | Adrian | H05K 7/20727 |
| 2021/0274684 A1 | 9/2021 | Ni et al. | |
| 2021/0349508 A1 | 11/2021 | Chang et al. | |
| 2023/0103177 A1* | 3/2023 | Ye | H05K 7/20727 |
| | | | 361/695 |

OTHER PUBLICATIONS

Cisco Systems, Inc., "Cisco UCS B200 M6 Blade Server Installation and Service Note," Aug. 24, 2021, 76 pages.

\* cited by examiner

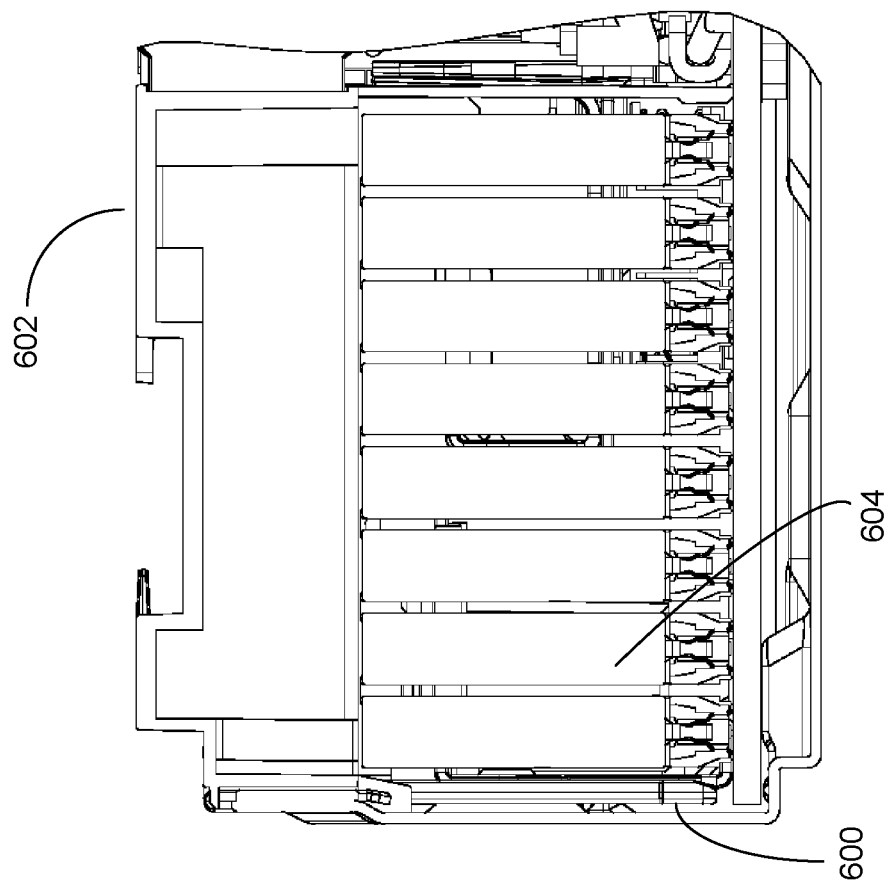
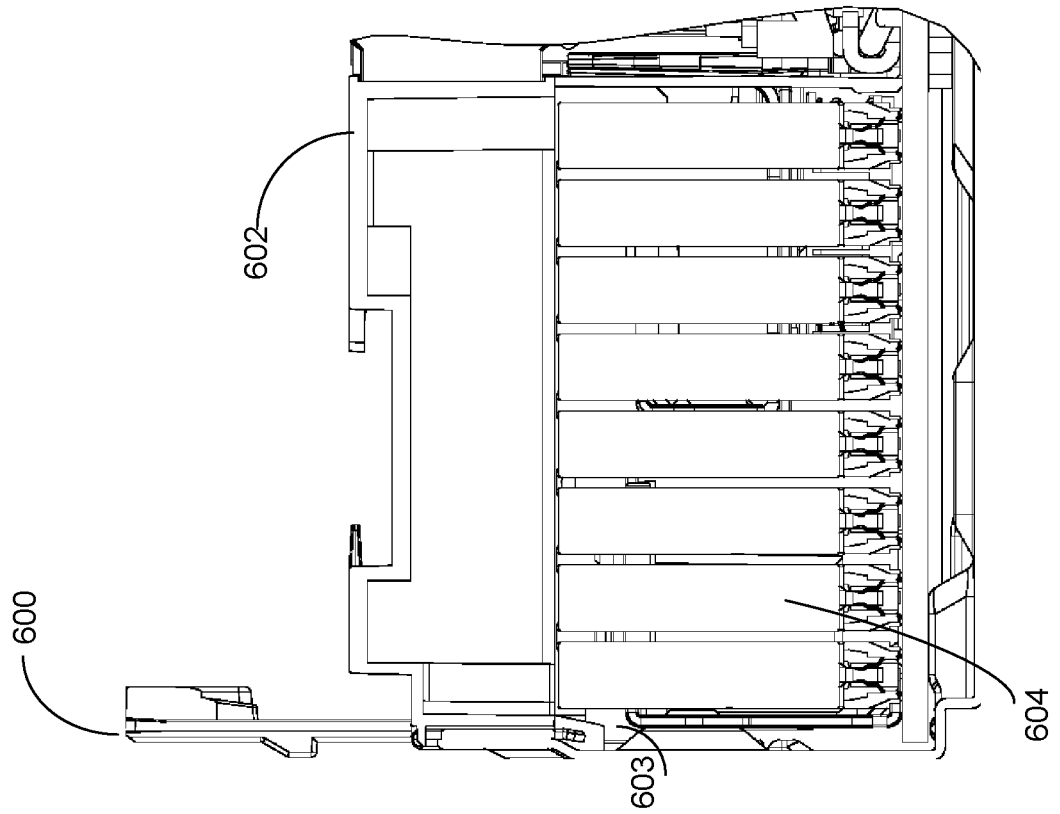
FIG. 6B
FIG. 6A

REMOVABLE AIR DAMS FOR AIR COOLING IN COMPUTER SYSTEMS

BACKGROUND

This disclosure is generally related to optimizing heat dissipation in computing devices. Specifically, this disclosure provides designs of removable air dams for optimizing airflow through memory components installed on a printed circuit board.

BRIEF DESCRIPTION OF THE FIGURES

FIGS. 6A and 6B show a frontal view of the process of installing an air dam in a DIMM baffle mounted on a chassis, in accordance with an aspect of the present application.

In the figures, like reference numerals refer to the same figure elements.

DETAILED DESCRIPTION

Figure 1:
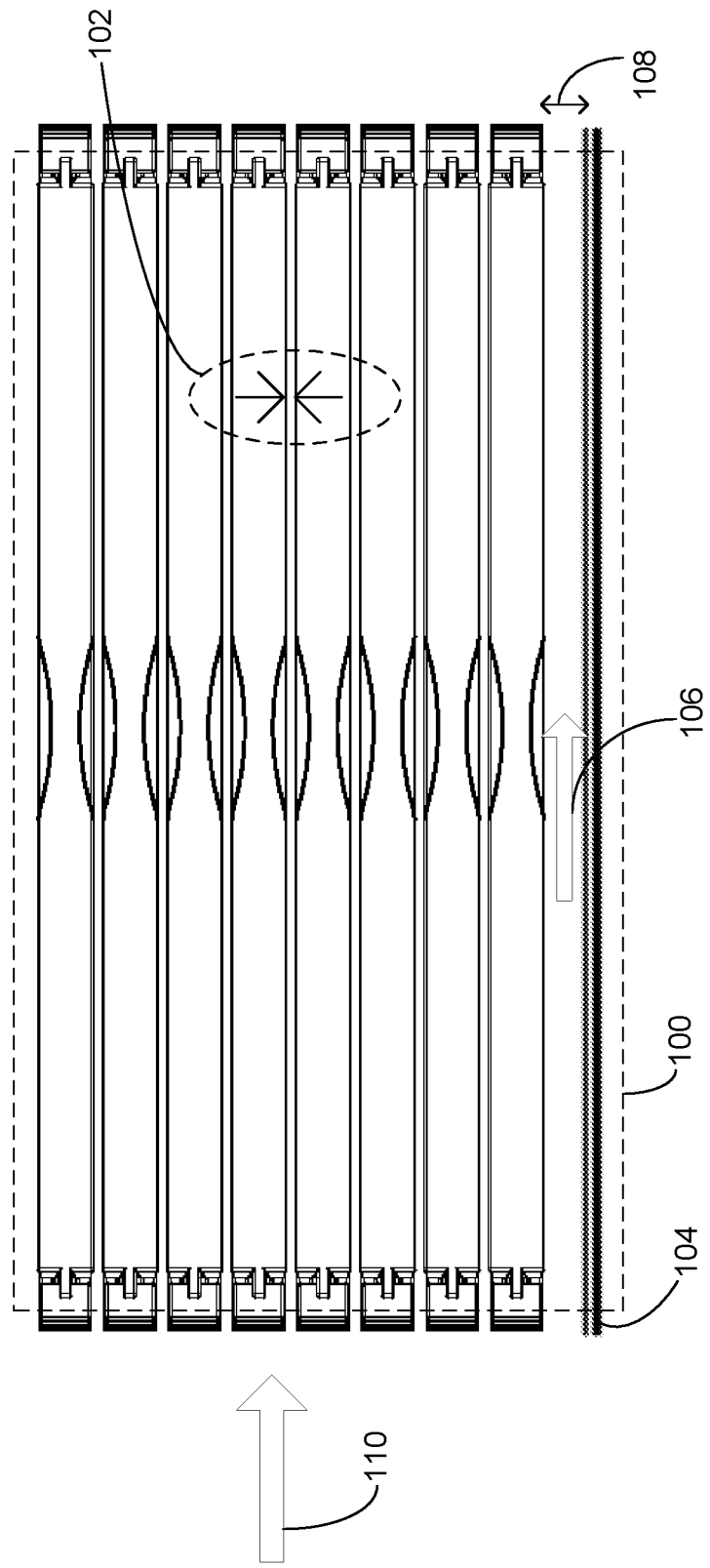
FIG. 1 illustrates a top-down view of DIMMs installed on a printed circuit assembly prior to installation of DIMM baffles and removable air dams, in accordance with an aspect of the present application.

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

With the rapid advancement in computer technology and growth in computationally intensive applications, there is a corresponding increase in the amount of heat generated by elements in computing systems, e.g., central processing units (CPUs), Dual Inline Memory Modules (DIMMS), peripheral component interconnect (PCI) cards, etc. These heat generating elements may be located on a single printed circuit board. During operation, the total amount of heat generated may exceed the thermal tolerance of these components and may damage them. This heat may be dissipated by an air-cooled mechanism. The air-cooled mechanism can include a number of fans moving air from an inlet to an outlet of the computing system.

To improve the airflow and increase the amount of heat dissipation from the components, current systems typically deploy baffles to force airflow into the memory modules. In general, air baffles are structures made of light material such as plastic to redirect airflow through heat-generating components to improve the efficiency of air cooling. Air baffles can be installed above the PCA or installed onto certain components such as DIMMs. However, due to space constraints, facilitating a balanced airflow for memory modules on the PCA can be challenging. For example, existing DIMM baffle designs use a single piece of material and usually do not provide room for additional materials to be installed on the chassis side wall in order to reduce air gaps that would otherwise waste air flows intended for cooling the PCA components. In addition, such baffles are typically installed above the DIMMs. When additional material is present in the area between the chassis side wall and the PCA, the DIMMs may malfunction or fail due to contact with such material. Therefore, to protect the DIMMs, a bypass (clearance) region sometimes is desirable. The clearance space between the PCA and chassis wall can also facilitate installation and removal of the PCA. On the other hand, as a design choice, some systems block the bypass region with permanent attachments, e.g., a piece of hard plastic material, which are not adjustable without expensive tooling changes.

Aspects described in this application solve the technical problem of providing an optimized balance airflow through DIMMs in a space constrained environment. Specifically, an improved air baffle design can allow installation of one or more removable air dams. These air dams can optimize the airflow through DIMMs by preventing air bypass and balance airflow impedances within the system. Furthermore, since the removal of the PCA from a chassis typically needs larger clearances near the edges of the PCA, the removable feature of the air dams can improve serviceability of the PCA.

In particular, the use of removable air dams on a DIMM baffle can provide improved adjustability of materials for blocking the bypass region. As a result, the thermal management of the computer systems can be fine-tuned. Furthermore, the PCA can be installed into a chassis without the DIMM baffle and the air dams. Subsequently, the DIMM baffle can be installed on the PCA, and the air dams can be installed into the DIMM baffle. This installation sequence can facilitate easier and more secure installation of the PCA. Similarly, to remove the PCA from the chassis, the air dams can first be removed from the DIMM baffle, which can subsequently be removed from the PCA prior to the removal of the PCA. Such flexibility is not available with conventional one-piece DIMM baffle design.

In this disclosure, a chassis refers to a metal structure or frame that can house one or more computing systems, which are also referred to as computing nodes or servers.

FIG. 1 illustrates a top-down view of DIMMs installed on a printed circuit assembly prior to installation of DIMM baffles and removable air dams, in accordance with an aspect of the present application. In this example, a number of DIMMs 100 are installed in the respective slots on the PCA.

To accommodate a desired number of DIMMs, a uniform pitch 102 is maintained among DIMMs 100. Furthermore, in a typical computing system, clearance 108 can be provided near chassis wall 104 to facilitate removal and serviceability of the PCA.

A DIMM baffle (not shown in FIG. 1A) may be positioned above and around DIMMs 100 to balance airflow 110 from the system fans through the DIMMs. When DIMMs 100 are located near chassis wall 104, clearance 108 may result in a large bypass region which can allow a large portion of airflow 106 to pass through. Airflow 106 is considered as waste or underutilized airflow as it does not contribute to the cooling of the DIMMs. Furthermore, since DIMMs 100 are tightly pitched (for example, pitch 102 between two adjacent DIMMs can be significantly narrower than the thickness of a single DIMM), only a small amount of airflow 110 can enter the space between adjacent DIMMs. A significant portion of airflow 110 will likely follow the path of least resistance (airflow 106 in this case), which can result in poor cooling of the DIMMs. Consequently, the DIMMs may operate at a higher-than-ideal temperature, which can shorten the memory device's life span and potentially cause the memory modules to fail.

As mentioned above, to facilitate more efficient air cooling inside a chassis, air baffles can be installed above DIMMs to improve cooling of the DIMMS and other components. Aspects of the present application provide removable air dams which can be installed into the DIMM baffles. The number of these removable air dams can be configured based on the cooling requirements of the system. A greater number of air dams installed on the DIMM baffle can more effectively block the bypass region and force more air on to the DIMMs. Moreover, these air dams can be installed after the DIMM baffle are installed on to the DIMMs, which makes the DIMM baffle installation easier and safer.

Figure 2A:
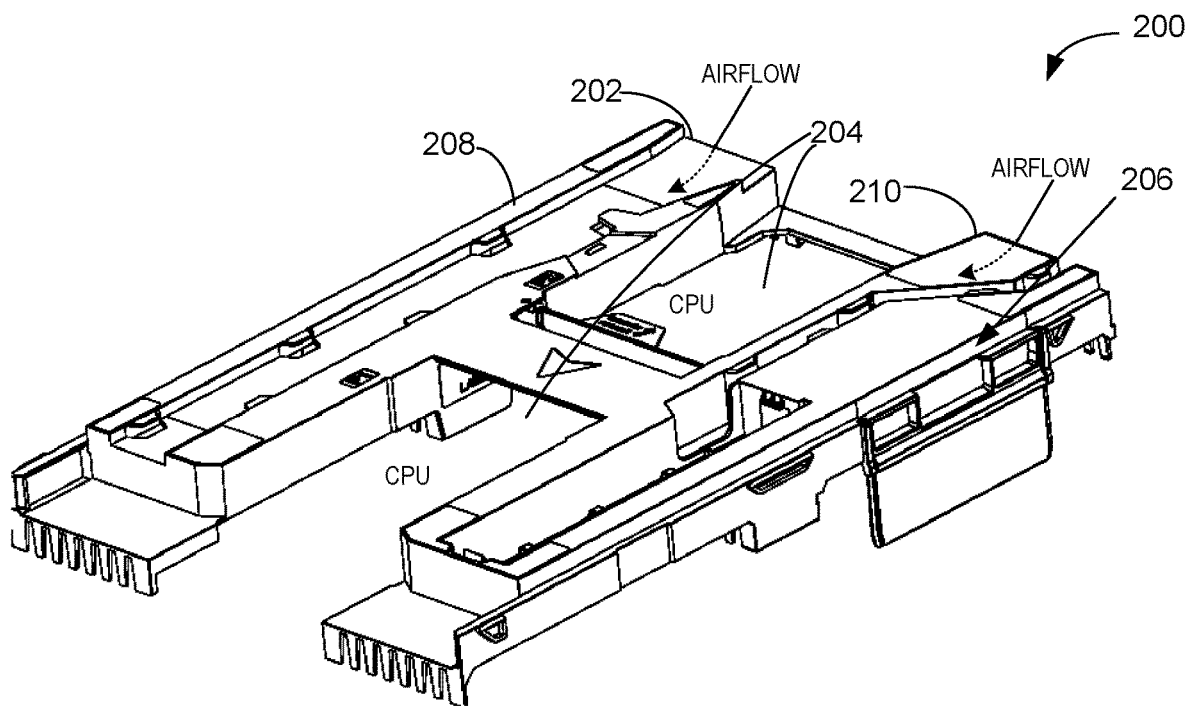
FIG. 2A shows an exemplary DIMM baffle design which facilitates installation of removable air dams, in accordance with an aspect of the present application.

FIG. 2A shows an exemplary DIMM baffle design which facilitates installation of removable air dams, in accordance with an aspect of the present application. In this example, DIMM baffle 200 can modulate the air flowing through the chassis by directing the airflow through the DIMMs which are covered by DIMM baffle 200. Such control of airflow can result in effective cooling of the DIMMs and can extend the useful life of the DIMMs.

DIMM baffles can be designed with different number of airflow passages based on the number and location of DIMMs on the PCA. DIMM baffles can be made of plastic or other material and can be mounted on the PCA or chassis to cover the DIMMs. In some aspects, the DIMM baffles can be removably installed on the PCA deployed on the chassis. In the example shown in FIG. 2A. DIMM baffle 200 can include a side airflow passage 202 that can cover one or more DIMM located on the corresponding side of the PCA. Airflow passage 202 can have an opening toward the source of the airflow, and have a tunnel that can constrain and guide the airflow through the DIMMs. Similarly, DIMM baffle 200 can include a center portion 204 which are openings for a pair of CPUs, and a side airflow passage 210 which can cover corresponding DIMMs installed on the PCA. Note that the DIMM baffle design in FIG. 2A corresponds to a PCA layout where two CPUs are located in the middle, with DIMM slots placed on both sides. Other PCA layouts and DIMM baffle designs are also possible.

When DIMMs are installed close to the edges of the PCA, the DIMMs can be adjacent to the chassis walls. In most systems, an opening or air bypass region can be present between the chassis wall and the PCA edge to facilitate installation and removal of the PCA. Due to the size of the air baffle and the small clearance between the DIMMs and the chassis side wall, in some applications, having permanent walls of the sides of the air baffle to fill the space can lead to damage to DIMMs during baffle installation. Therefore, in some cases, it is desirable to leave the opening or air bypass region unobstructed during baffle installation.

The presence of this large opening or air bypass region can result in a significant portion of air flowing towards DIMM baffles 200 to flow through the bypass region. The bypass airflow contributes little to the cooling of the DIMMs. To optimize the airflow through DIMMs, one aspect of the present application provides a DIMM baffle design that includes slots into which air dams can be installed. As shown in FIG. 2A, DIMM baffle 200 can include slots 206 and 208, located respectively on each side facing the walls of the chassis when DIMM baffle 200 is installed on a PCA. Note that slot 208 is positioned opposite to slot 206, on the other side of DIMM baffle 200 which is not visible in FIG. 2A. Air dams can be inserted into slots 206 and 208 to limit the airflow in the bypass region. More details on slots 206 and 208 are provided in the description below in conjunction with FIGS. 3A and 3B.

Figure 2B:
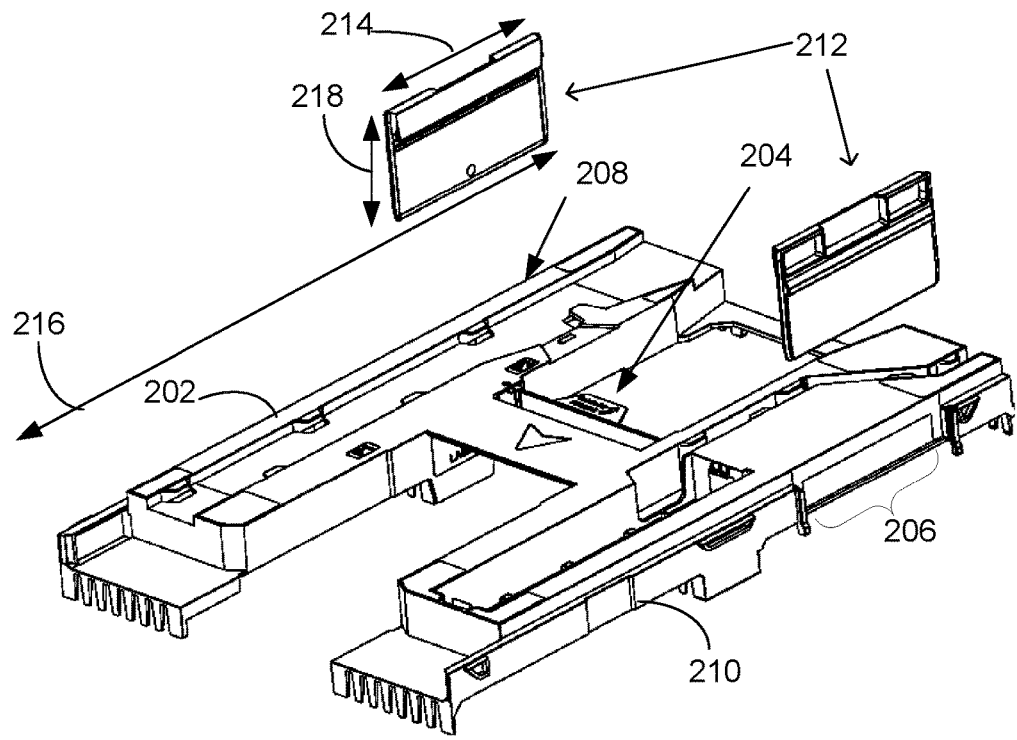
FIG. 2B shows the DIMM baffle of FIG. 2A with air dams uninstalled, in accordance with an aspect of the present application.

FIG. 2B shows the DIMM baffle of FIG. 2A with air dams installed, in accordance with an aspect of the present application. In this example air dams 212 can be installed in DIMM baffle 200 in corresponding slots 206 and 208. Furthermore, DIMM baffle 200 shown in FIG. 2B can accommodate one air dam in each slot. Nevertheless, DIMM baffle 200 can be configured to include a greater number of slots to accommodate more air dams, depending on the computer system's specifications, amount of heat generated by the components, and thermal management strategies for the computer system. In other words, based on the computer system's needs, the number of air dams installed in the air baffle (or DIMM baffle) can be customized. For example, in computer systems with lower power consumption the number of air dams installed can be reduced. On the other hand, in computer systems with high power consumption, a greater number of air dams can be installed in the air baffle to satisfy the impedance and air velocity constraints so that the PCA components are effectively cooled.

In one aspect, length 214 of air dam 212 can be approximately less than half of length 216 of air baffle, and height 218 of air dam 212 can be substantially equal to the height of the air baffle, which measured from an upper surface of the air baffle to the floor of the chassis when the air baffle is installed on the chassis.

Figure 3A:
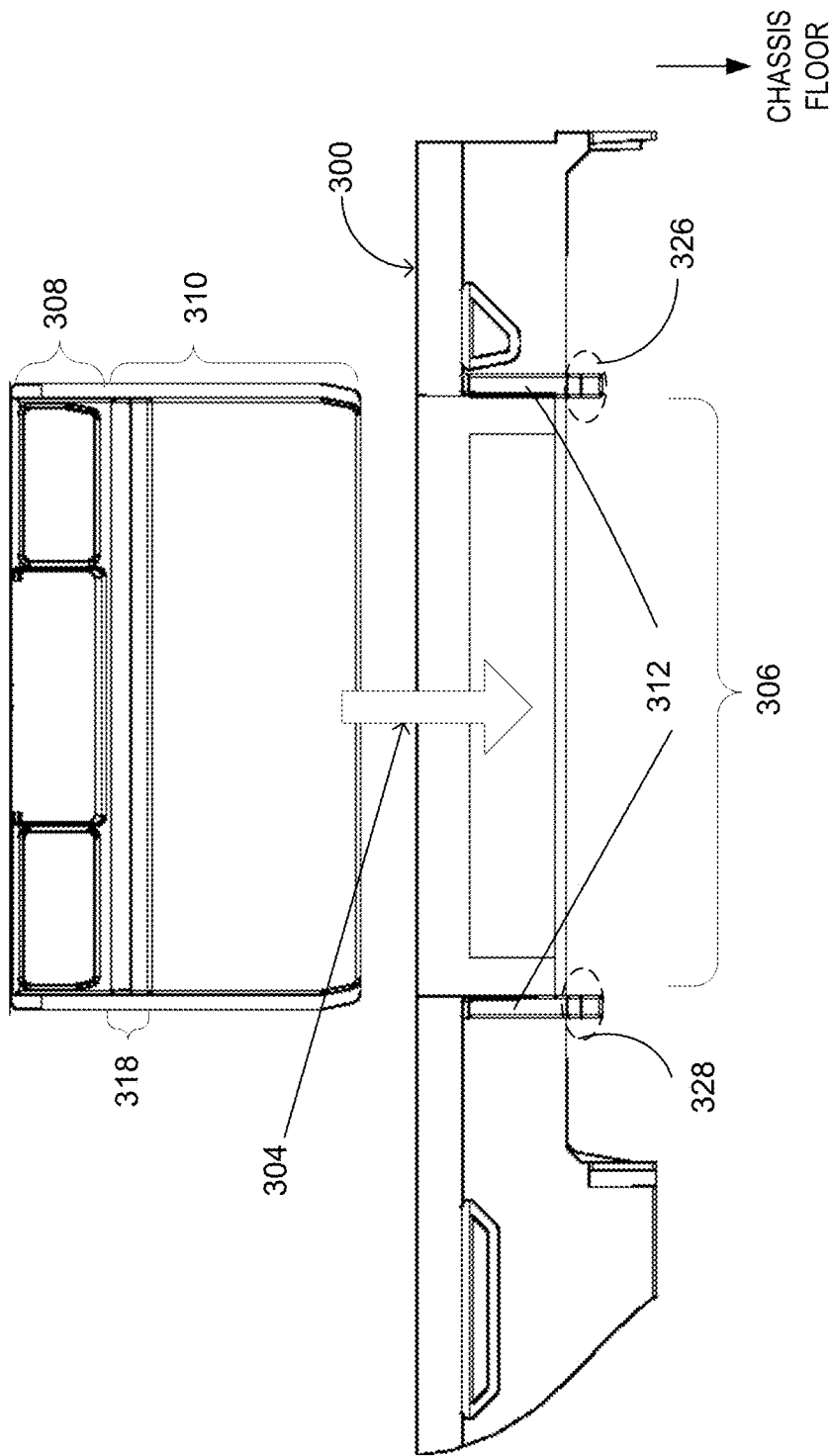
FIG. 3A shows an exemplary installation process of an air dam into a slot on a DIMM baffle, in accordance with an aspect of the present application.

FIG. 3A shows an exemplary installation process of an air dam into a slot on a DIMM baffle, in accordance with an aspect of the present application. In this example, a DIMM baffle body 300 can include one or more slots (one slot 306 is shown in FIG. 3A) to accommodate an air dam 302. The slots can be located on a portion of DIMM baffle 300 that is adjacent to a chassis wall when DIMM baffle 300 is installed in a chassis. In one aspect, DIMM baffle 300 can be first mounted on a PCA deployed in the chassis. Air dam 302 can subsequently be inserted in a direction 304 into slot 306.

Air dam 302 can be made of a plastic material. Depending on the application and configuration of the server, other materials may be utilized. Note that because the air dam is separate from the DIMM baffle, it is now possible to change the design of the air dam while the design of the DIMM baffle remains the same. This flexibility allows the main baffle body to be used in other products or different versions or generations of the same product, which can save manufacturing cost because re-tooling for different designs of the DIMM baffle body can be expensive. Different air dam designs can be used to fill larger or smaller gaps between the DIMMs and chassis side walls in different server configurations.

In one aspect, air dam 302 can include a first portion 308 and a second portion 310. In addition, slot 306 can include alignment rails 312 to guide the installation of air dam 302 into slot 306. (More details on alignment rails 312 are provided below in conjunction with FIG. 3B.) Upon installation of air dam 302, first portion 308 can fit into slot 306 while second portion 310 is inserted into slot 306 and extends down towards the floor of the chassis, as indicated by the arrow in the lower right corner of FIG. 3A. Furthermore, air dam 302 can optionally include stop members 318 to allow air dam 302 to latch with corresponding mechanical stops 326 and 328 (see description below in conjunction with FIG. 3B).

Figure 3B:
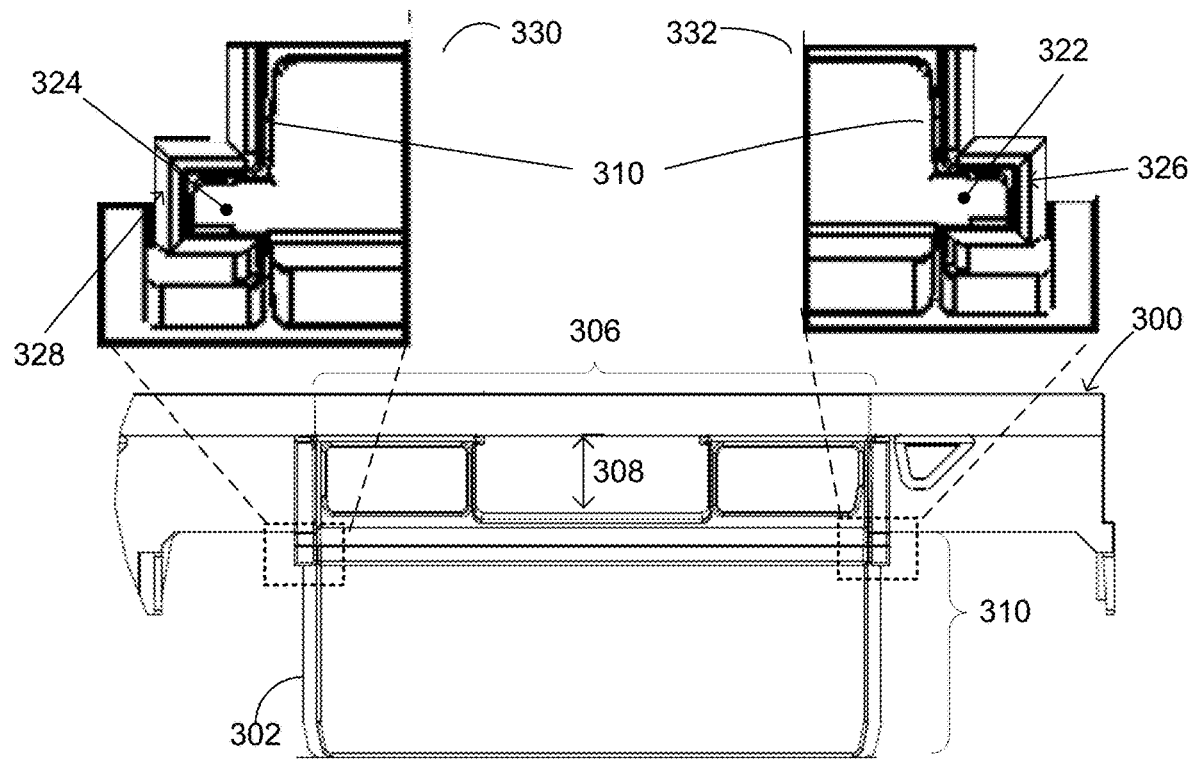
FIG. 3B illustrates structural details of an exemplary slot in the DIMM baffle for installation of the air dam as depicted in FIG. 3A, in accordance with an aspect of the present application.

FIG. 3B illustrates structural details of an exemplary slot in the DIMM baffle for installation of an air dam as depicted in FIG. 3A, in accordance with an aspect of the present application. In one aspect, the DIMM baffle can provide alignment rails to guide the installation of the air dams, which can also help prevent damage to expensive DIMMs. In the example shown in FIG. 3B, an air dam 302 can be installed into a slot 306 provided on one side of a DIMM baffle 300. Slot 306 in DIMM baffle 300 can include alignment rails, which are formed with mechanical stops 326 and 328. After installation of air dam 302, first portion 308 of air dam 302 can fit into slot 306, and second portion 310 can be extended outside slot 306 towards the floor of the chassis. Second portion 310 can include stop members 322 and 324 for engaging respectively with corresponding mechanical stops 326 and 328, which can be located at the bottom of the alignment rails.

FIG. 3B also includes expanded views of alignment or retention rails in slot 306 with air dam 302 installed. Specifically, expanded view 330 shows the alignment rail on the left edge of slot 306 and expanded view 332 shows the right edge of slot 306. The alignment rail shown in view 330 can include a mechanical stop 328. A portion of air dam 302 that fits into the alignment rail includes a stop member 324 to latch with mechanical stop 328. Similarly, the alignment rail shown in view 332 can include a mechanical stop 326 and a portion of air dam 302 that fits into the alignment rail can include a stop member 322 to latch with mechanical stop 326.

During the installation of air dam 302, these mechanical stops can prevent air dam 302 from traveling too far downward and stop air dam 302 with the desired amount of extension toward the chassis floor. The alignment rails can be built into DIMM baffle slot 306 to control the movement of air dam 302 while it slides down toward the floor of the chassis and to protect the DIMMs and other PCA components from potential damage that can be caused by incorrect installation positions of air dam 302. Different numbers of slots can be provided on DIMM baffle 300 to install more than two air dams on the sides of DIMM baffle 300. The number of installed air dams can be based on the computer system's air-cooling requirement. Since the number of installed air dams is customizable, DIMM baffle 300 can address different thermal constraints for different system specifications without expensive modifications to the main DIMM baffle body. In one aspect, the DIMM baffle can provide a predetermined number of slots, and the number of installed air dams on the DIMM baffle can be different from the number of available slots on the DIMM baffle. The number of installed air dams can be customized according to the desired amount of air cooling for the DIMMs.

Note that modifying the DIMM baffle to include a permanent piece of material along the entire length of the DIMM to reduce the bypass region can be expensive and potentially damage the memory module or PCA components close to the chassis wall. The multiple-slot configuration of the present baffle design can allow different numbers of air dams to be installed. The size of the air dam can be relatively small in comparison with the length of the DIMM baffle. For example, the length of the air dams can be approximately ⅓ or ¼ of the length of the DIMM baffle. Other dimensions for the air dams are also possible. The ability to install a customizable number of smaller, removable air dams can provide greater flexibility to accommodate different system thermal requirements. Furthermore, since the air dams can be removed when the PCA needs to be relocated or removed, the likelihood of damage to the PCA can be reduced.

Figure 3C:
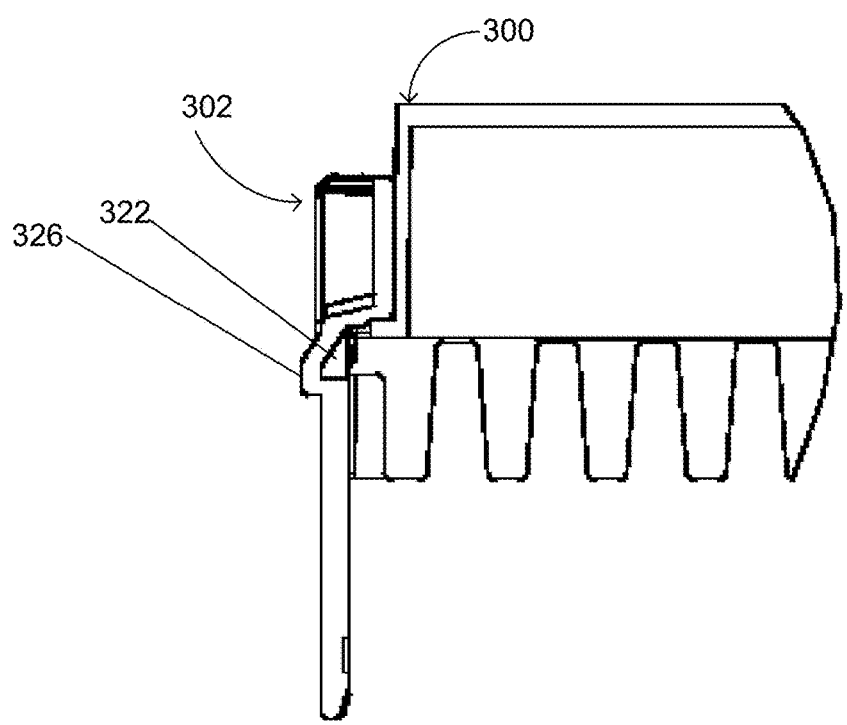
FIG. 3C illustrates a side view of the air dam installed into the DIMM baffle in conjunction with FIGS. 3A and 3B, in accordance with an aspect of the present application.

FIG. 3C illustrates a side view of the air dam installed into the DIMM baffle in conjunction with FIGS. 3A and 3B, in accordance with an aspect of the present application. As shown in FIG. 3C, DIMM baffle 300 can include a mechanical stop 326 to secure air dam 302 in place and to prevent air dam 302 from traveling too far toward the chassis floor. Furthermore, air dam 302 can also include a stop member 322 to latch with mechanical stop 326. Such controlled installation of air dams through the slots can ensure consistent installation quality while preventing potential damages to the PCA components and DIMMs.

Figure 4:
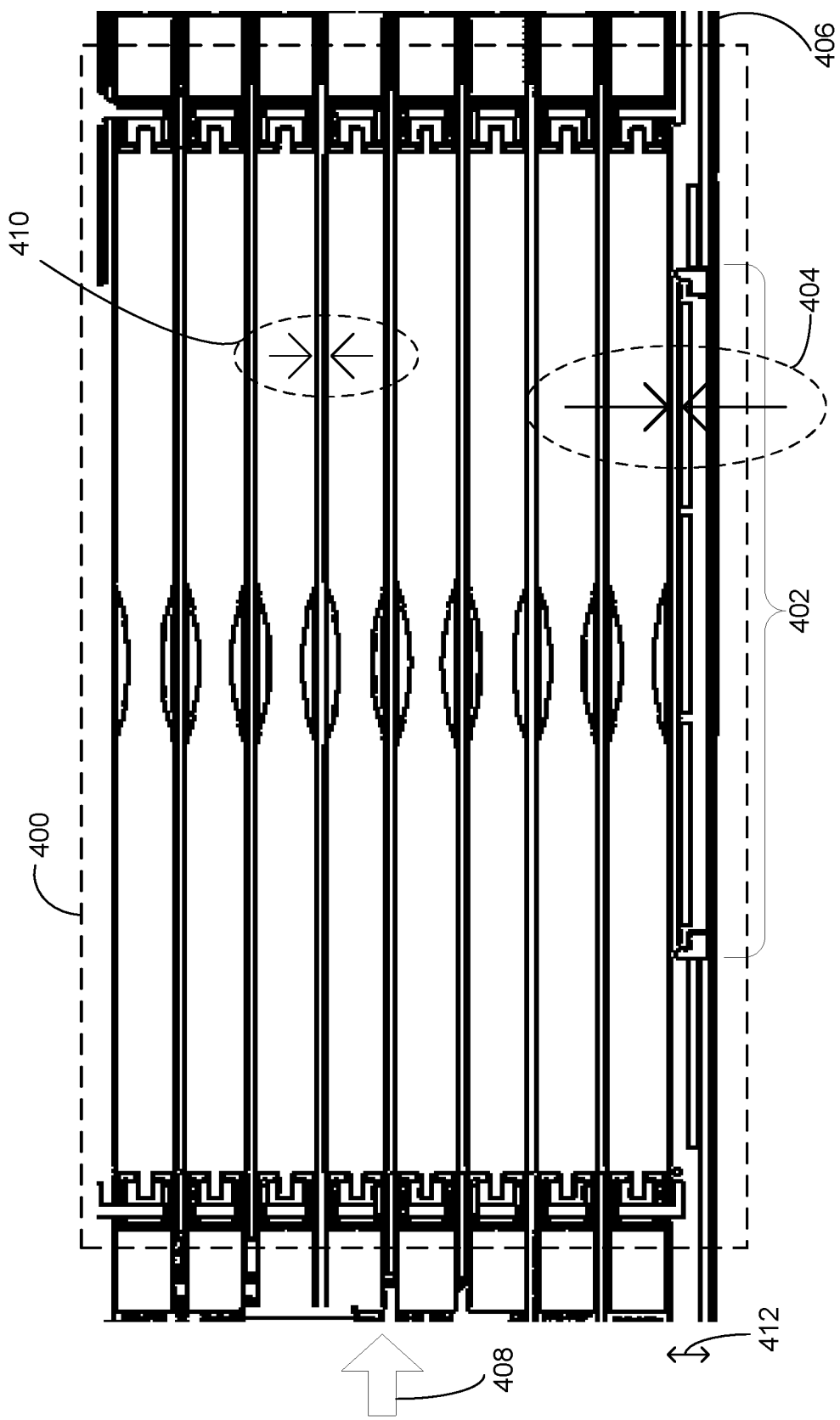
FIG. 4 illustrates a top-down, cross sectional view of air dams installed into a DIMM baffle, in accordance with an aspect of the present application.

FIG. 4 illustrates a top-down view of air dams installed into a DIMM baffle, in accordance with an aspect of the present application. In this example, a DIMMs 400 are installed in their respective slots on the PCA. A DIMM baffle (not shown in FIG. 4) may be positioned above DIMMs 400 to balance airflow 408 produced by the computer system's fans. To accommodate a desired number of DIMMs, a tight uniform pitch 410 can be maintained between DIMMs 400 (for example, a pitch of 5 mm or less). Furthermore, in a computing system, a bypass region 412 is provided near chassis wall 406 to facilitate easy removal of the PCA.

The air flowing through bypass region 412 may contribute little to the cooling of DIMMs 400. Furthermore, since DIMMs 400 are tightly pitched, more air will likely flow through the bypass region rather than through the DIMMs, which can result in poor cooling and impact the performance of the computer system.

After a set of air dams 402 are installed in DIMM baffle, these air dams can occupy bypass region 412 and hence reduce the amount of wasted airflow. In some aspects, installed air dams 402 can form an air channel 404 that is similar to DIMM pitch 410. This configuration can equalize airflow 408 among all the DIMMS by forcing more air toward the center of DIMMs 400. This is because when air channel 404 has a similar width as DIMM pitch 410, airflow 408 is subject to similar resistance through air channel 404 as the channel formed between adjacent DIMMs. As a result, the amount of air flowing between adjacent DIMMs is similar to that flowing through air channel 404.

As mentioned above, a large opening is typically desirable near chassis wall 104 to facilitate easy removal and serviceability of the PCA. The removeable nature of air dams 402 can provide benefits which are unavailable with permanent air baffle implementations. This is because removal of the PCA from the chassis often need relatively large clearances near the edges of the PCA. When air dams 402 are deployed in bypass region 412, air dams 402 can provide the thermal benefit of a permanent air baffle, prevent damage to the DIMMs during baffle installation, and can be removed to allow for normal function and serviceability of the chassis and PCA. When installed, the air dams can reduce airflow 408 through bypass region 412 and allow airflow 408 to be focused through DIMM baffle 400, thereby maximizing the cooling of PCA components.

Figure 5A:
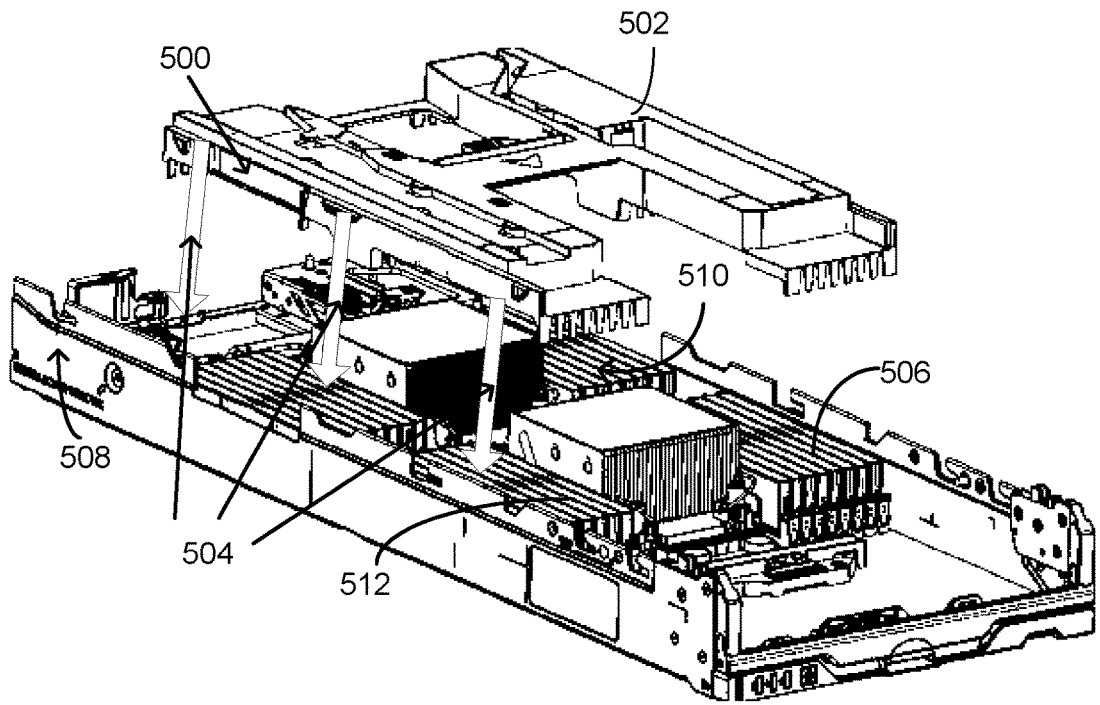
FIG. 5A illustrates an exemplary installation process of a DIMM baffle in a chassis, in accordance with an aspect of the present application.

FIG. 5A illustrates an exemplary installation process of a DIMM baffle in a chassis, in accordance with an aspect of the present application. In this example, after DIMMs 506, 510, and 512, and processors have been installed in chassis 508, DIMM baffle 502 can be installed. DIMM baffle 502 can be installed along direction 504 to approximately align with the chassis features. Mechanical features of DIMM baffle 502 can prevent contact of entire DIMM baffle 502 with the top of DIMMs 506, 510, and 512, thereby preventing potential mechanical damage to DIMMs 506, 510, and 512.

Figure 5B:
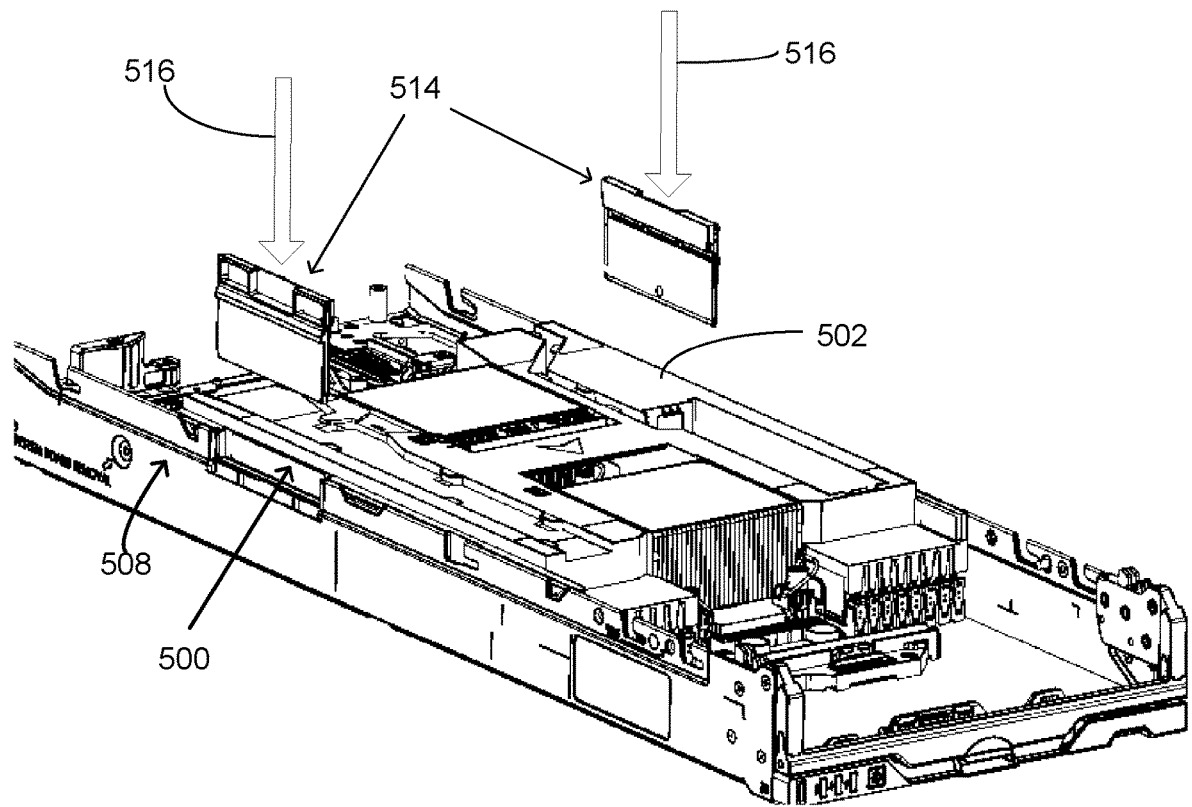
FIG. 5B illustrates an exemplary installation process of air dams after the DIMM baffle has been installed in the chassis as illustrated in FIG. 5A, in accordance with an aspect of the present application.

FIG. 5B illustrates an exemplary installation process of air dams after the DIMM baffle has been installed in the chassis as illustrated in FIG. 5A, in accordance with an aspect of the present application. After DIMM baffle 502 is installed and stabilized in chassis 508, air dams 514 can be installed along direction 516 into slots provided in DIMM baffle 502. In the example shown in FIG. 5B, two air dams 514 are shown, however, DIMM baffle 502 can include more than two slots to accommodate a greater number of air dams. The number of air dams installed can depend on the thermal management strategy for a given system. Air dams 514 can be installed at precise locations provided in DIMM baffle 502, which can prevent damage to the DIMMs and reduce undesirable air bypass.

FIGS. 6A and 6B show a frontal view of the process of installing an air dam in a DIMM baffle mounted on a chassis, in accordance with an aspect of the present application. As shown in FIG. 6A, a DIMM baffle 602 includes a slot 603 on a side adjacent to the wall of the chassis to accommodate air dam 600. Note that in FIG. 6A, air dam 600 is not yet installed and is shown to be placed above slot 603. FIG. 6B shows DIMM baffle 602 after air dam 600 is installed, i.e., after air dam 600 is inserted into slot 603. Slot 603 can prevent air dam 600 from being in contact with DIMMs 604 and safely guide air dam 600 during installation. Slot 603 can also hold air dam 600 in place with a mechanical stop. After air dam 600 has been installed and held in place, air dam 600 can prevent air flowing through the bypass region and allow more air to flow through DIMMs 604.

In summary, the DIMM baffle with removable air dams installed can optimize airflow through the DIMMs of current and future generation of computing systems. The reconfigurability of the number of installed air dams can allow the same DIMM baffle to be used in different classes of computing systems and meet different air-cooling requirements. Furthermore, the removability of the air dams provides better serviceability of the chassis and ease of installation of PCAs and prevents potential DIMM and component damage during the baffle installation process.

One aspect described in the present disclosure provides an air baffle assembly for optimizing airflow through memory components deployed on a printed circuit assembly. The air baffle assembly can include a baffle body removably installed on a printed circuit assembly deployed on a chassis. The baffle body can cover memory components positioned on the printed circuit assembly. The air baffle assembly can further include at least one air dam removably installed on the baffle body. The baffle body can include at least one slot positioned on a side of the baffle body. The side can be substantially parallel to a wall of the chassis. A region between the side of the baffle body and the chassis wall forms a bypass region. The baffle body can also include two alignment rails positioned in the slot to guide installation of the air dam into the slot, the installed air dam to reduce the bypass region, thereby reducing airflow through the bypass region and increasing airflow through the memory components.

In a variation on this aspect, the baffle body is to be removably installed on the printed circuit assembly prior to the at least one air dam being installed.

In a variation on this aspect, the slot allows the air dam to be removed to facilitate serviceability of the chassis.

In a variation on this aspect, the baffle body includes a plastic material.

In a variation on this aspect, the two alignment rails are positioned on two edges of the slot to facilitate controlled installation of the air dam.

In a further variation, the baffle body is shaped to cover dual inline memory modules (DIMMs) installed on the printed circuit assembly.

In a further variation, the air dam has a length that is less than half of length of the side of the baffle body. In addition, the air dam has a height that is substantially equal to a height of the baffle body measured from a floor of the chassis after the baffle body installed on the printed circuit assembly.

In a further variation, the air dam includes a first portion and a second portion. The first portion fits into the slot provided on the baffle body. After the air dam is installed, the second portion remains outside the slot and extends towards the floor of the chassis. The second portion can include stop members for engaging with corresponding mechanical stop in the alignment rails.

In a further variation, each alignment rail includes a mechanical stop to engage with the air dam and to prevent the air dam from over-travel when the air dam is installed.

In a further variation, a reconfigurable number of air dams cab be installed in the baffle body based on thermal management requirements for components on the printed circuit assembly.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. An air baffle assembly, comprising:
    a baffle body configured to be removably installed on a printed circuit assembly deployed on a chassis such that the baffle body covers memory components positioned on the printed circuit assembly, wherein the chassis comprises a floor supporting the printed circuit assembly and two lateral walls coupled to the floor, a primary airflow direction through the chassis is parallel to the lateral walls; and
    an air dam configured to be removably installed on the baffle body;
    wherein the baffle body comprises an outer lateral side and a slot positioned on the outer lateral side of the baffle body and configured to removably receive the air dam, wherein, in an installed state of the baffle body on the printed circuit assembly, the outer lateral side of the baffle body is substantially parallel to one of the lateral walls of the chassis and a gap therebetween forms a bypass region; and
    wherein the baffle body comprises two alignment rails positioned in the slot to guide installation of the air dam into the slot, and the air dam is configured to, in the installed state of the baffle body on the printed circuit assembly and an installed state of the air dam in the slot, extend into the bypass region and reduce an amount of airflow which bypasses the memory components via the bypass region.

2. The air baffle assembly of claim 1, wherein the slot allows the air dam to be removed to facilitate serviceability of the chassis.

3. The air baffle assembly of claim 1, wherein the baffle body comprises a plastic material.

4. The air baffle assembly of claim 1, wherein the two alignment rails are positioned on two edges of the slot to facilitate controlled installation of the air dam.

5. The air baffle assembly of claim 1, wherein the memory components comprise dual inline memory modules (DIMMs) installed on the printed circuit assembly and the baffle body is shaped to cover the DIMMs in the installed state of the baffle body on the printed circuit assembly.

6. The air baffle assembly of claim 1,
wherein the air dam has a length that is less than half of length of the outer lateral side of the baffle body; and
wherein the air dam has a height that is substantially equal to a height of the baffle body, wherein in the installed state of the air baffle body on the printed circuit assembly and the installed state of the air dam in the slot, the respective lengths of the air dam and the outer lateral side of the baffle body extend parallel to the airflow direction and the respective heights of the air dam and the baffle body extend perpendicular to the floor of the chassis.

7. The air baffle assembly of claim 1, wherein each alignment rail includes a mechanical stop to engage with a corresponding stop member in the air dam and to prevent the air dam from over-travel when the air dam is installed.

8. The air baffle assembly of claim 1, comprising at least one additional slot configured to receive at least one additional air dam.

9. The air baffle assembly of claim 1,
wherein the air dam is configured to be installed in the slot by sliding relative to the baffle body along the two alignment rails.

10. The air baffle assembly of claim 9,
wherein the air dam is configured sliding along the two alignment rails in a direction perpendicular to the floor of the chassis.

11. The air baffle assembly of claim 1,
wherein the air dam includes a first portion and a second portion;
wherein the second portion has a length, a height, and a thickness, the thickness being shorter than the length and the height, the length and the height defining a face;
wherein, in the installed state of the baffle body on the printed circuit assembly and the installed state of the air dam in the slot:
the first portion is received into the slot and the second portion is positioned outside the slot in the bypass region and extending from the first portion towards the floor of the chassis; and
the face is parallel to the lateral side of the baffle body.

12. A computing system, comprising:
a chassis comprising a floor and first and second lateral walls coupled to the floor, a primary airflow direction through the chassis being parallel to the lateral walls;
a printed circuit assembly deployed on the floor of the chassis, the printed circuit assembly comprising a plurality of memory components;
an air baffle assembly comprising:
a baffle body removably installed on the printed circuit assembly and comprising an outer lateral side facing the first lateral wall of the chassis and a slot positioned on the outer lateral side of the baffle body, wherein the baffle body covers the plurality of memory components; and
an air dam removably installed in the slot of the baffle body;
wherein the outer lateral side of the baffle body is substantially parallel to the first lateral wall of the chassis and a gap therebetween forms a bypass region; and
wherein the baffle body comprises two alignment rails positioned in the slot to guide installation of the air dam into the slot, and the air dam extends into the bypass region and reduces an amount of airflow which bypasses the memory components via the bypass region.

13. The computing system of claim 12, wherein the plurality of memory components comprises dual inline memory modules (DIMMs).

14. The computing system of claim 12,
wherein the air dam has a length that is less than half of a length of the outer lateral side of the baffle body; and
wherein the air dam has a height that is substantially equal to a height of the baffle body, wherein the respective lengths of the air dam and the outer lateral side of the baffle body extend parallel to the primary airflow direction and the respective heights of the air dam and the baffle body extend perpendicular to the floor of the chassis.

15. The computing system of claim 12, wherein each alignment rail includes a mechanical stop to engage with a corresponding stop member in the air dam and to prevent the air dam from over-travel when the air dam is being installed.

16. The computing system of claim 12, wherein the air baffle body comprises at least one additional slot configured to receive at least one additional air dam.

17. The computing system of claim 12,
wherein the air dam is configured to be installed in the slot by sliding relative to the baffle body along the two alignment rails.

18. The computing system of claim 12,
wherein the air dam includes a first portion received into the slot and a second portion positioned outside the slot in the bypass region and extending from the first portion towards the floor of the chassis;
wherein the second portion has a length, a height, and a thickness, the thickness being shorter than the length and the height, the length and the height defining a face parallel to the first lateral wall of the chassis.

19. A method of assembling the computing system of claim 12, comprising:
installing the baffle body on the printed circuit assembly in a state of the air dam being disconnected from the baffle body; and
after installing the baffle body on the printed circuit assembly, installing the air dam in the slot.

20. The method of claim 19,
wherein installing the air dam in the slot comprises sliding the air dam relative to the baffle body along the two alignment rails in a direction perpendicular to the floor of the chassis.

* * * * *